United States Patent

Shen et al.

(10) Patent No.: US 10,503,670 B2
(45) Date of Patent: Dec. 10, 2019

(54) DYNAMIC PER-BANK AND ALL-BANK REFRESH

(71) Applicant: Advanced Micro Devices, Inc., Sunnyvale, CA (US)

(72) Inventors: Guanhao Shen, Austin, TX (US); Ravindra N. Bhargava, Austin, TX (US); James Raymond Magro, Austin, TX (US); Kedarnath Balakrishnan, Whitefield (IN); Jing Wang, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 70 days.

(21) Appl. No.: 15/851,324

(22) Filed: Dec. 21, 2017

(65) Prior Publication Data

US 2019/0196987 A1 Jun. 27, 2019

(51) Int. Cl.
*G06F 13/16* (2006.01)
*G11C 11/406* (2006.01)
*G06F 13/42* (2006.01)

(52) U.S. Cl.
CPC ...... *G06F 13/1636* (2013.01); *G06F 13/1642* (2013.01); *G06F 13/4234* (2013.01); *G11C 11/40603* (2013.01)

(58) Field of Classification Search
CPC ............. G06F 13/4234; G06F 13/1626; G06F 13/1636; G06F 13/1689; G06F 13/1642;
(Continued)

(56) References Cited

U.S. PATENT DOCUMENTS 6,400,631 B1 6/2002 Williams et al.
7,362,643 B2 4/2008 Okada
(Continued)

FOREIGN PATENT DOCUMENTS

WO 2016137760 9/2016

OTHER PUBLICATIONS

International Search Report and Written Opinion in International Application No. PCT/US2018/051774, dated Dec. 21, 2018, 12 pages.

*Primary Examiner* — Zhuo H Li
(74) *Attorney, Agent, or Firm* — Meyertons Hood Kivlin Kowert and Goetzel PC; Rory D. Rankin

(57) ABSTRACT

Systems, apparatuses, and methods for performing efficient memory accesses in a computing system are disclosed. In various embodiments, a computing system includes computing resources and a memory controller coupled to a memory device. The memory controller determines a memory request targets a given rank of multiple ranks. The memory controller determines a predicted latency for the given rank as an amount of time the pending queue in the memory controller for storing outstanding memory requests does not store any memory requests targeting the given rank. The memory controller determines the total bank latency as an amount of time for refreshing a number of banks which have not yet been refreshed in the given rank with per-bank refresh operations. If there are no pending requests targeting the given rank, each of the predicted latency and the total bank latency is used to select between per-bank and all-bank refresh operations.

17 Claims, 5 Drawing Sheets

(58) Field of Classification Search
CPC ........ G11C 11/40603; G11C 11/40607; G11C 11/40615; G11C 11/40618
See application file for complete search history.

(56) References Cited

U.S. PATENT DOCUMENTS

| | | | |
|---|---|---|---|
| 8,151,044 B2 | 4/2012 | Proesbsting | |
| 2002/0067649 A1* | 6/2002 | Kitamoto | G11C 7/1006 365/222 |
| 2013/0212330 A1 | 8/2013 | Brittain et al. | |
| 2014/0185403 A1* | 7/2014 | Lai | G11C 11/40626 365/222 |
| 2015/0206574 A1* | 7/2015 | Greathouse | G06F 13/1636 711/103 |
| 2015/0318035 A1 | 11/2015 | Dong et al. | |
| 2016/0307619 A1* | 10/2016 | Chang | G11C 5/14 |
| 2017/0040050 A1 | 2/2017 | Chang et al. | |
| 2018/0046389 A1* | 2/2018 | Park | G06F 3/0619 |

* cited by examiner

DYNAMIC PER-BANK AND ALL-BANK REFRESH

BACKGROUND

Description of the Related Art

When a memory access for a given thread misses in a last-level cache of a computing system, a request is sent to system memory. Memory access latencies for system memory, such as off-chip dynamic random access memory (DRAM), are typically much greater than access latencies to cache. To reduce the effect of such latencies, and taking into account that read operations are often on the critical path for program execution, read operations may be assigned a higher priority than write operations. Nevertheless, because the memory bus may utilize a bi-directional shared-bus structure, switching the driving direction of the bus must be performed and an added data bus turnaround latency still exist.

To increase bandwidth and further reduce latency, the DRAM may be organized into independent ranks and support memory access pipelining. Generally speaking, DRAM stores data in a buffer from an activated row in a given bank. However, unlike static RAM (SRAM), DRAM does not have an equal access time for each storage access. Rather, receiving read data from system memory has a longer latency than sending write data to system memory. In addition to the above, accesses to the system memory use multiple transactions. For example, DRAM transactions such as precharge, activation/open for a row, column read access of an open row, column write access of an open row, and close of an open row, are required depending on the circumstances. Further, each of these various transactions may have a different latency. Often, the activation and precharge transactions have significantly higher latencies than the read access and write access transactions.

Some memory accesses, such as consecutive accesses to a same row of a bank, use fewer of the above transactions. Other memory accesses require more transactions. For example, memory transactions that include consecutive accesses to different banks where the requested row is not open will require more transactions. In addition to the above, when to close a row after it has been accessed is one determination by the control logic in the DRAM which affects performance and power consumption.

In view of the above, efficient methods and systems for performing efficient memory accesses for a computing system are desired.

BRIEF DESCRIPTION OF THE DRAWINGS

The advantages of the methods and mechanisms described herein may be better understood by referring to the following description in conjunction with the accompanying drawings, in which.

Figure 1:
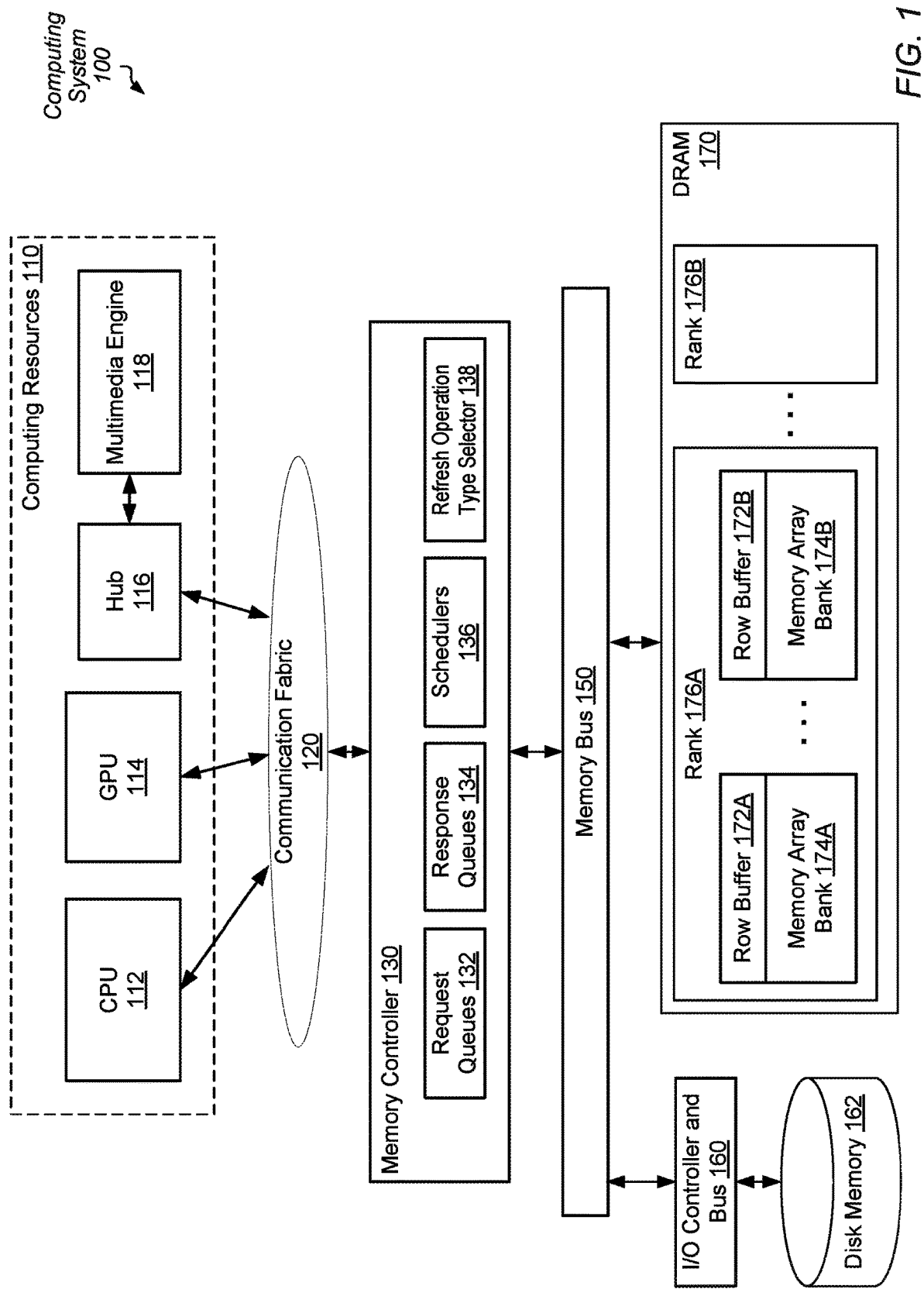
FIG. 1 is a block diagram of one embodiment of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for performing efficient memory accesses for a computing system are disclosed. In one embodiment, a computing system includes one or more computing resources and external system memory such as one of a variety of types of dynamic random access memory (DRAM). Examples of the computing resources include a general-purpose central processing unit (CPU), a graphics processing unit (GPU), an accelerated processing unit (APU), and so forth. In various embodiments, a given computing resource includes a cache memory subsystem. When the given computing resource determines a memory access request misses within the cache memory subsystem, the given computing resource sends the memory access request to a given memory controller of one or more memory controllers.

The given memory controller is coupled to a memory device that is associated with a target address of the memory access request. If the computing system includes multiple memory devices, then the address spaces are distributed among the multiple memory devices by the operating system. The memory controller supports mapping between the request addresses of the computing resources and addresses pointing to storage locations in the memory device(s). In some embodiments, a memory controller is connected to a single memory device. In other embodiments, a memory controller is connected to multiple memory devices.

In an embodiment, control logic in the memory controller receives information regarding a workload to be executed by the one or more computing resources. For example, the control logic receives a unique computing resource identifier (ID) of a given computing resource and a number of threads to process. In some embodiments, an operating system (OS) scheduler sends the computing resource ID and the number of threads to the memory controller. For example, the OS scheduler can send an ID corresponding to a CPU and the number of threads that are scheduled on the CPU. Similarly, the OS scheduler can send a different ID corresponding to a GPU and the number of threads that are scheduled on the GPU.

In various embodiments, the control logic in the memory controller predicts a latency based at least upon the received information. The predicted latency for a given rank is the predicted amount of time from a most recent memory access targeting the given rank sent from the memory controller to receipt by the memory controller of another memory access targeting the given rank. In various embodiments, the memory controller includes a pending queue to store received memory access requests. The memory controller then retrieves memory access requests from the pending queue for conveyance to the memory. In such an embodiment, the predicted latency is an amount of time the pending queue for storing outstanding memory requests does not store any memory requests targeting the given rank.

For example, particular computing resources are selected to process certain applications. At times, the behavior of the processing of a certain application includes a given number of memory access misses in the cache memory subsystem for the particular computing resource. These misses lead to a number of memory requests being sent to the system memory via the memory controller. In some embodiments, the OS scheduler also sends a unique application ID to the memory controller identifying a particular application or type of application corresponding to the miss. The application type can also be used to predict memory access misses and determine the predicted latency.

The memory controller translates the target address of a received memory request to indications of a target rank, a target bank within the target rank, and a target row within the target bank. The memory controller is capable of maintaining an access history that relates the computing resource ID and the number of threads to the ranks targeted by memory requests. In some embodiments, the relating performed by the memory controller also uses the application ID. In some embodiments, the computing resources or a power manager also sends power-performance states (p-states) corresponding to the computing resources to the memory controller. In an embodiment, the memory controller maintains one or more tables with the received information and determines under which conditions particular ranks are accessed. Further, the memory controller is configured to determine the predicted latency described earlier.

In various embodiments, a computing resource sends a resource ID and a number of threads it is scheduled to process when the computing resource receives threads for execution. In one embodiment, the computing resource sends an update of the number of threads when a difference in the number above a threshold occurs. For example, if an increase in the number of threads exceeds a threshold, then the computing resource sends an updated number to the memory controller. Similarly, if a reduction in the number falls below a threshold, then the computing resource sends an updated number to the memory controller.

In yet other embodiments, a computing resource sends updates of cache miss rate information corresponding to the cache memory subsystem used by the computing resource. In an embodiment, a miss rate for each level of the hierarchical cache memory subsystem is sent by the computing resource. In another embodiment, a single combined miss rate is sent. Similar to the number of threads, the miss rate information is sent when changes that cross thresholds are detected. In various embodiments, the memory controller additionally uses one or more of the p-states and miss rates when determining under which conditions particular ranks are accessed and predicting the latencies described earlier.

In an embodiment, when the memory controller receives an indication to start a refresh interval for a given rank in the memory device, the memory controller selects one or more refresh operations based at least upon the predicted latency for the given rank. In one embodiment, the memory controller compares the predicted latency and a latency of an all-bank refresh operation. The latency of the all-bank refresh operation is the amount of time it takes to refresh all banks in the given rank. In one example, the given rank includes 8 banks and no pending memory requests are permitted to access any of the 8 banks in the given rank while the all-bank refresh operation is performed on the given rank. In various embodiments, the latency of the all-bank refresh operation is a constant value. For example, the latency of the all-bank refresh operation may be approximately 130 nanoseconds (ns). The latency can also be measured as a number of clock cycles.

In contrast, the latency for a per-bank refresh operation is typically smaller than the latency of the all-bank refresh operations. In one example, the latency for the per-bank refresh operation can reach 60 ns. However, while one bank of the 8 banks is being refreshed and is unavailable for access by pending memory requests, the other 7 banks are available for access by pending memory requests. In one embodiment, the memory controller selects a per-bank refresh operation to perform on a given bank of the multiple banks in the given rank when the memory controller determines there are pending memory requests targeting the given rank. In an embodiment, the memory controller selects a per-bank refresh operation to perform on a given bank of the multiple banks in the given rank when the memory controller determines the predicted latency is less than the latency of the all-bank refresh operation and there are no pending memory requests targeting the given rank.

In some embodiments, the memory controller determines a total bank latency as an amount of time for refreshing a number of banks which have not yet been refreshed in the given rank with per-bank refresh operations. In another embodiment, the memory controller performs the per-bank refresh operation for the given rank responsive to determining the predicted latency is greater than the latency of the all-bank refresh operation, the total bank latency is less than the latency of the all-bank refresh operation, and there are one or more pending memory requests targeting the given rank. In other embodiments, the memory controller performs the per-bank refresh operation for the given rank responsive to determining the predicted latency is less than the latency of the all-bank refresh operation.

Referring to FIG. 1, a generalized block diagram of one embodiment of a computing system 100 is shown. As shown, computing system 100 includes communication fabric 120 between each of memory controller 130 and computing resources 110. In the illustrated embodiment, the computing resources include central processing unit (CPU) 112, graphics processing unit (GPU) 114 and Hub 116. Hub 116 is used for communicating with Multimedia Engine 118. Although a single memory controller 130 is shown, in other embodiments, another number of memory controllers are used in computing system 100.

In some embodiments, the components of computing system 100 are individual dies on an integrated circuit (IC), such as a system-on-a-chip (SOC). In other embodiments, the components are individual dies in a system-in-package (SiP) or a multi-chip module (MCM). In one embodiment, computing system 100 is a stand-alone system within a mobile computer, a smart phone, a smartwatch, or a tablet; a desktop; a server; or other. The CPU 112, GPU 114 and Multimedia Engine 118 are examples of computing resources capable of generating memory access requests. Although not shown, in other embodiments, other types of computing resources are included in computing resources 110.

In various embodiments, memory controller 130 receives memory access requests from computing resources 110 via the communication fabric 120 and sends the memory access requests to one or more of off-chip disk memory 162 and system memory, which is implemented as off-chip dynamic random access memory (DRAM) 170. Memory controller 130 also receives responses from DRAM 170 and disk memory 162 and sends the responses to a corresponding source of the request in computing resources 110.

Each of the one or more processor cores in CPU 112 includes circuitry for executing instructions according to a given selected instruction set architecture (ISA). In various embodiments, each of the processor cores in CPU 112 includes a superscalar, multi-threaded microarchitecture used for processing instructions of the given ISA. In an embodiment, GPU 114 includes a high parallel data microarchitecture with a significant number of parallel execution lanes. In one embodiment, the microarchitecture uses single-instruction-multiple-data (SIMD) pipeline for the parallel execution lanes. Multimedia Engine 118 includes processors for processing audio data and visual data for multimedia applications.

In one example, an accelerated processing unit (APU), a display controller, an audio processor, and so forth, are additional candidates to be included in processing units 110. An example of an APU is a CPU integrated on a same die with a GPU, a FPGA, or other processing unit, thus improving data transfer rates between these units while reducing power consumption. In other embodiments, the APU includes video processing and other application-specific accelerators.

In various embodiments, communication fabric 120 transfers traffic back and forth between computing resources 110 and memory controller 130 and includes interfaces for supporting respective communication protocols. In some embodiments, communication fabric 120 includes queues for storing requests and responses, selection logic for arbitrating between received requests before sending requests across an internal network, logic for building and decoding packets, and logic for selecting routes for the packets.

In some embodiments, the address space of the computing system 100 is divided among at least CPU 112, GPU 114 and Hub 116 and one or more other components such as input/output peripheral devices (not shown) and other types of computing resources. Memory maps are maintained for determining which addresses are mapped to which component, and hence to which one of CPU 112, GPU 114 and Hub 116 a memory request for a particular address should be routed. One or more of computing resources 110 include cache memory subsystems to reduce memory latencies for a respective processor core. In addition, in some embodiments, a shared cache memory subsystem is used by processor cores as a last-level cache (LLC) before accessing the off-chip DRAM 170 and/or the off-chip disk memory 162. The cache memory subsystems (not shown) in the computing resources 110 include high-speed cache memories configured to store data. In various embodiments, the cache memory subsystems are implemented as a hierarchy of caches. As used herein, the term "memory access" refers to performing a memory read request or a memory write request operation that results in a cache hit if the requested data of a corresponding request address resides in the cache. Alternatively, the memory access request results in a cache miss if the requested data does not reside in the cache.

Memory controller 130 sends memory access requests to off-chip DRAM 170 through the memory bus 150. Responsive to a cache miss, corresponding data is conveyed from the off-chip DRAM 170 to a cache memory subsystem in processing units 110 in order to complete the original memory access request. In various embodiments, off-chip DRAM 170 includes a multi-channel memory architecture. This type of architecture increases the transfer speed of data to the memory controller 130 by adding more channels of communication between them. In an embodiment, the multi-channel architecture utilizes multiple memory modules and a motherboard and/or a card capable of supporting multiple channels. In some embodiments, DRAM 170 utilizes three-dimensional integrated circuits (3D ICs) to provide system memory. In such an embodiment, the 3D integrated DRAM provides both low-latency interconnects and additional on-chip memory storage to reduce off-chip memory accesses. In various embodiments, DRAM 170 is used as system memory for computing system 100. Other memory technologies for system memory that use a row-based access scheme including one or more row buffers or other equivalent structures are possible and contemplated. Examples of other memory technologies include phase-change memories, spin-torque-transfer resistive memories, memristors, and so forth.

As shown, DRAM 170 includes multiple ranks 176A-176B, each with multiple memory array banks. For example, as shown rank 176A includes memory array banks 174A-174B. Each of the banks 174A-174B includes a row buffer 172A-172B. Each of the row buffers 172A-172B stores data corresponding to an accessed row of the multiple rows within the memory array banks 174A-174B. The accessed row is identified by a DRAM address in the received memory access request. Control logic within DRAM 170 performs transactions such as activation and precharge of data and control lines within DRAM 170 to read data from an identified row and to write data to an identified row.

In various embodiments, DRAM 170 includes one or more memory channels, one or more memory modules or devices per channel, one or more ranks per memory module, one or more banks per rank, and one or more rows per bank. Typically, each row stores a page of data. The size of the page is chosen based on design considerations. Such a page size can be one kilobyte (1 KB), four kilobytes (4 KB), or otherwise. In various embodiments, memory bus 150 utilizes a bi-directional shared-bus structure.

If a cache miss occurs in the cache memory subsystem, then a memory access request is generated to retrieve requested data. Memory controller 130 translates the target addresses of memory access requests received from computing resources 110. In various embodiments, to perform a memory access control logic in the memory controller 130 determines a target rank of ranks 176A-176B, a target bank of memory array banks 174A-174B, and a target page within the target bank.

As shown in FIG. 1, memory controller 130 includes request queues 132 for queuing memory access requests received from computing resources 110 via communication fabric 120. Memory controller 130 also has a response queue 134 for storing responses received from DRAM 170. In various embodiments, request queues 132 include one or more queues for storing both read and write memory access requests. In another embodiment, request queues 132 include separate queues for storing read and write requests. In yet other embodiments, request queues 132 include one or more queues for storing received memory access requests and a separate queue for storing scheduled memory access requests selected from the one or more queues.

Schedulers 136 in FIG. 1 include logic for selecting memory access requests stored in request queues 132 for issue to DRAM 170. In various embodiments, memory requests may be selected in-order or out-of-order. Out-of-order selection of requests by the memory controller 130 may be based on priority levels, quality-of-service indications, age, process or thread identification, target addresses, a relationship with other stored requests such as targeting a same memory channel, targeting a same rank, targeting a same bank and/or targeting a same page, or otherwise. Similarly, in some embodiments the memory controller 130 also supports out-of-order issue of read responses (i.e., retrieved read data) to computing resources 110.

Refresh Operation Type Selector 138 (also referred to as "selector" 138) is used to predict a latency for a given rank based at least in part on information corresponding to upcoming or current operating conditions. The predicted latency is an amount of time predicted to elapse from when a last remaining memory access targeting a given rank is sent from the memory controller to a point in time when a subsequent memory access targeting the given rank is received by the memory controller. In various embodiments, the predicted latency is an amount of time the pending queue in request queues 132 for storing outstanding memory requests does not store any memory requests targeting the given rank. Refresh Operation Type Selector 138 selects one or more refresh operations during a refresh interval for the given rank based at least upon the predicted latency.

In various embodiments, selector 138 receives a computing resource identifier (ID) identifying one of the computing resources 110 and a number of threads assigned to the identified one of the computing resources 110. In some embodiments the operating system (OS) scheduler sends this information, while in other embodiments the computing resources 110 send this information to the selector 138. In some embodiments, the computing resources 110 or a power manager (not shown) sends power-performance states (p-states) corresponding to the computing resources 110 to the selector 138. In other embodiments, one or more of the computing resources 110 send a cache hit and/or miss rates for the cache memory subsystem accessed by the computing resource. For example, a product of each of the individual miss rates is used. In yet other embodiments, a respective weight is associated with each level of the hierarchical cache memory subsystem, and the weights are used in a weighed sum or sent as individual values to selector 138. In some embodiments, updated values of the number of threads being processed and the miss rates are sent when changes in these values exceed corresponding thresholds. In various embodiments, the selector 138 predicts a corresponding latency for each of the ranks 176A-176B based on the received information.

In various embodiments, when the memory controller 130 receives an indication to start a refresh interval for a given rank of ranks 176A-176B, the selector 138 selects one or more refresh operations based at least upon the predicted latency for the given rank. In one embodiment, selector 138 compares the predicted latency and a latency of an all-bank refresh operation. In some embodiments, the latencies are measured as a number of clock cycles. In various embodiments, selector 138 determines a total bank latency as an amount of time for refreshing a number of banks which have not yet been refreshed in the given rank with per-bank refresh operations. For example, if the latency for the per-bank refresh operation is 60 ns, and 6 of the 8 banks in the given rank are already refreshed, then the total bank latency is 2 remaining banks times 60 ns/bank, or 120 ns. The total bank latency can also be measured as a number of clock cycles.

In some embodiments, selector 138 selects the all-bank refresh operation for the given rank responsive to determining the predicted latency is greater than the latency of the all-bank refresh operation, the total bank latency is greater than the latency of the all-bank refresh operation, and there are no pending memory requests in request queues 132 targeting the given rank. In some embodiments, selector 138 selects the per-bank refresh operation for the given rank responsive to determining there are one or more pending memory requests in request queues 132 targeting the given rank. In other embodiments, selector 138 selects the per-bank refresh operation for the given rank responsive to determining the predicted latency is less than the latency of the all-bank refresh operation.

In various embodiments, memory bus 150 supports sending data traffic in one direction at a time, such as during a read mode or a write mode. In an embodiment, the memory bus 150 uses at least a command bus and a data bus and supports a read mode for receiving data traffic on the data bus from DRAM 170 to the memory controller 130. Additionally, memory bus 150 supports a write mode for sending data traffic on the data bus from memory controller 130 to DRAM 170.

Figure 2:
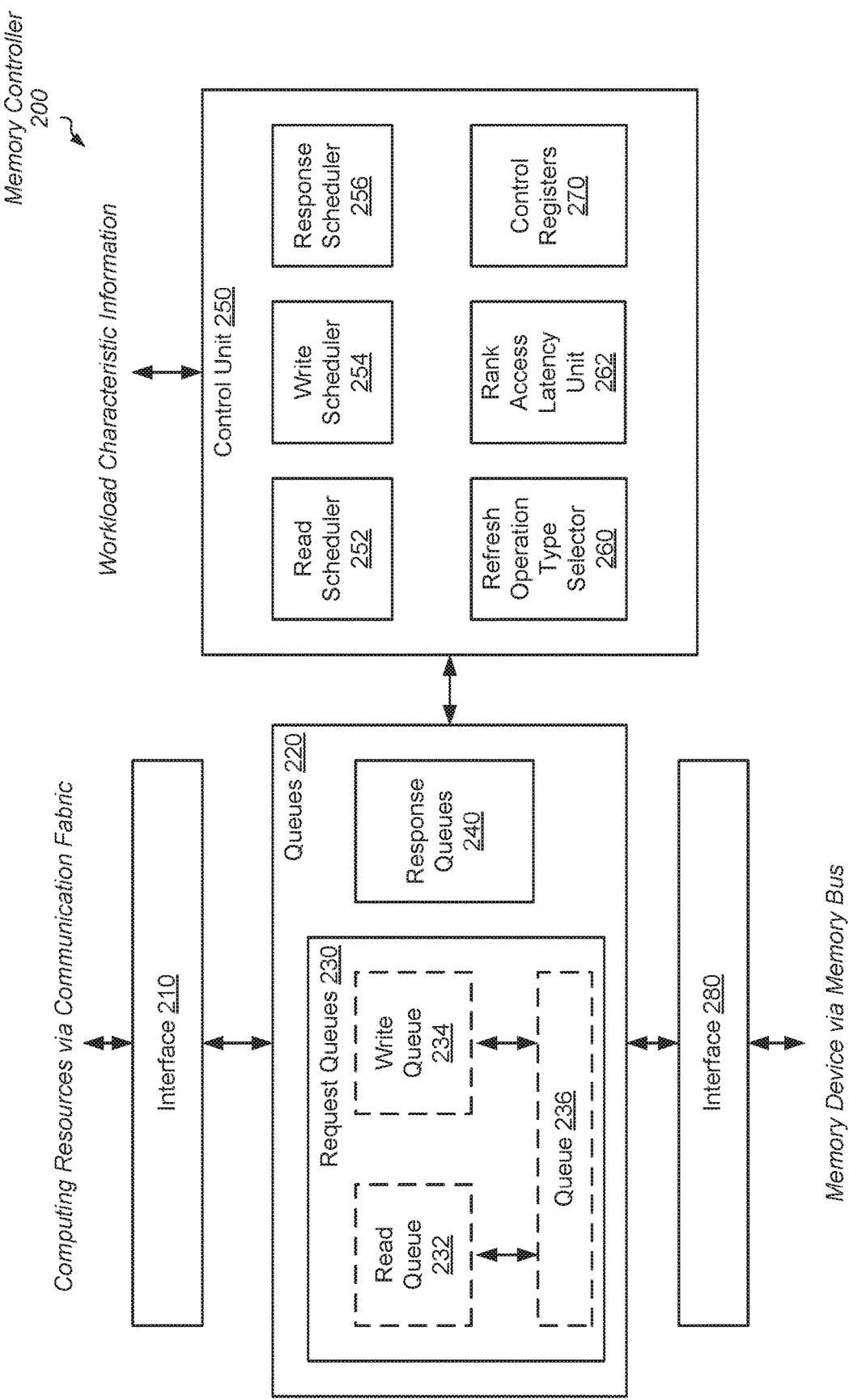
FIG. 2 is a block diagram of one embodiment of a memory controller.

Referring to FIG. 2, a generalized block diagram of one embodiment of a memory controller 200 is shown. In the illustrated embodiment, memory controller 200 includes an interface 210 to computing resources via a communication fabric, queues 220 for storing received memory access requests and received responses, control unit 250 and an interface 280 to a memory device via at least a data bus of a memory bus. Each of interfaces 210 and 280 supports respective communication protocols.

In an embodiment, queues 220 includes a read queue 232 for storing received read requests and a separate write queue 234 for storing received write requests. In other embodiments, queues 220 includes a unified queue for storing both memory read requests and memory write requests. In one embodiment, queues 220 includes queue 236 for storing scheduled memory access requests selected from read queue 232, write queue 234 or a unified queue if one is used. Queue 236 is also referred to as pending queue 236. In some embodiments, control registers 270 store an indication of a current mode. For example, the off-chip memory data bus and memory device support either a read mode or a write mode at a given time. Therefore, traffic is routed in a given single direction during the current mode and changes direction when the current mode ends.

In some embodiments, read scheduler 252 includes arbitration logic for selecting read requests from the read queue 232 out-of-order. Read scheduler 252 schedules the out-of-order issue of the stored requests within the read queue 232 to the memory device based on a quality-of-service (QoS) or other priority information, age, a process or thread identifier (ID), and a relationship with other stored requests such as targeting a same memory channel, targeting a same rank, targeting a same bank and/or targeting a same page. Write scheduler 254 includes similar selection logic for the write queue 234. In an embodiment, response scheduler 256 includes similar logic for issuing, based on priorities, responses out-of-order to the computing resources, which were received from the memory device.

Rank Access Latency Unit 262, which is also referred to as unit 262, predicts a latency for a given rank based at least upon received information corresponding to upcoming or current operating conditions. The predicted latency is from a first point-in-time that a last memory access targeting a given rank is sent from pending queue 236 to be serviced to a second point-in-time that a subsequent memory access targeting the given rank is stored in pending queue 236. In other words, the predicted latency is an amount of time pending queue 236 does not store any memory requests targeting the given rank. In various embodiments, unit 262 receives one or more of computing resource IDs, a number of threads assigned to computing resources, p-states of computing resources, and miss rates of cache memory subsystems. Based on the received information and mappings of targeted addresses to ranks in the memory device, unit 262 determines the predicted latencies for the ranks. Multiple programmable registers in control registers 270 store one or more thresholds used by unit 262 for determining the predicted latencies for multiple ranks in the memory device.

In some embodiments, unit 262 also determines a total bank latency as an amount of time for refreshing a number of banks which have not yet been refreshed in the given rank with per-bank refresh operations. In an embodiment, when the memory controller 200 receives an indication to start a refresh interval for a given rank in the memory device, Refresh Operation Type Selector 260 selects one or more refresh operations based at least upon the predicted latency and the total bank latency determined by unit 262 for the given rank. Refresh Operation Type Selector 260 selects is also referred to as selector 260. Rather than maintain a count of banks already refreshed in the given rank, selector 260 compares the predicted latency determined by unit 262 and the latency of an all-bank refresh operation to select refresh operations. Therefore, in one example, when a rank includes 8 banks and 6 banks are refreshed, selector 260 is still able to select the all-bank refresh operation to complete refreshing banks in the refresh interval, rather than be forced to select the per-bank refresh operation.

The per-bank refresh operation allows accesses to 7 of the 8 banks while a selected bank is being refreshed. However, when 6 of the 8 banks are refreshed, and the predicted latency determined by unit 260 is greater than the refresh latency of the all-bank refresh operation, selector 260 can still select the all-bank refresh operation. When the predicted latency is correct, no memory accesses are blocked, since pending queue 236 has no memory requests targeting the given rank while the all-bank refresh operation refreshes all 8 banks.

Figure 3:
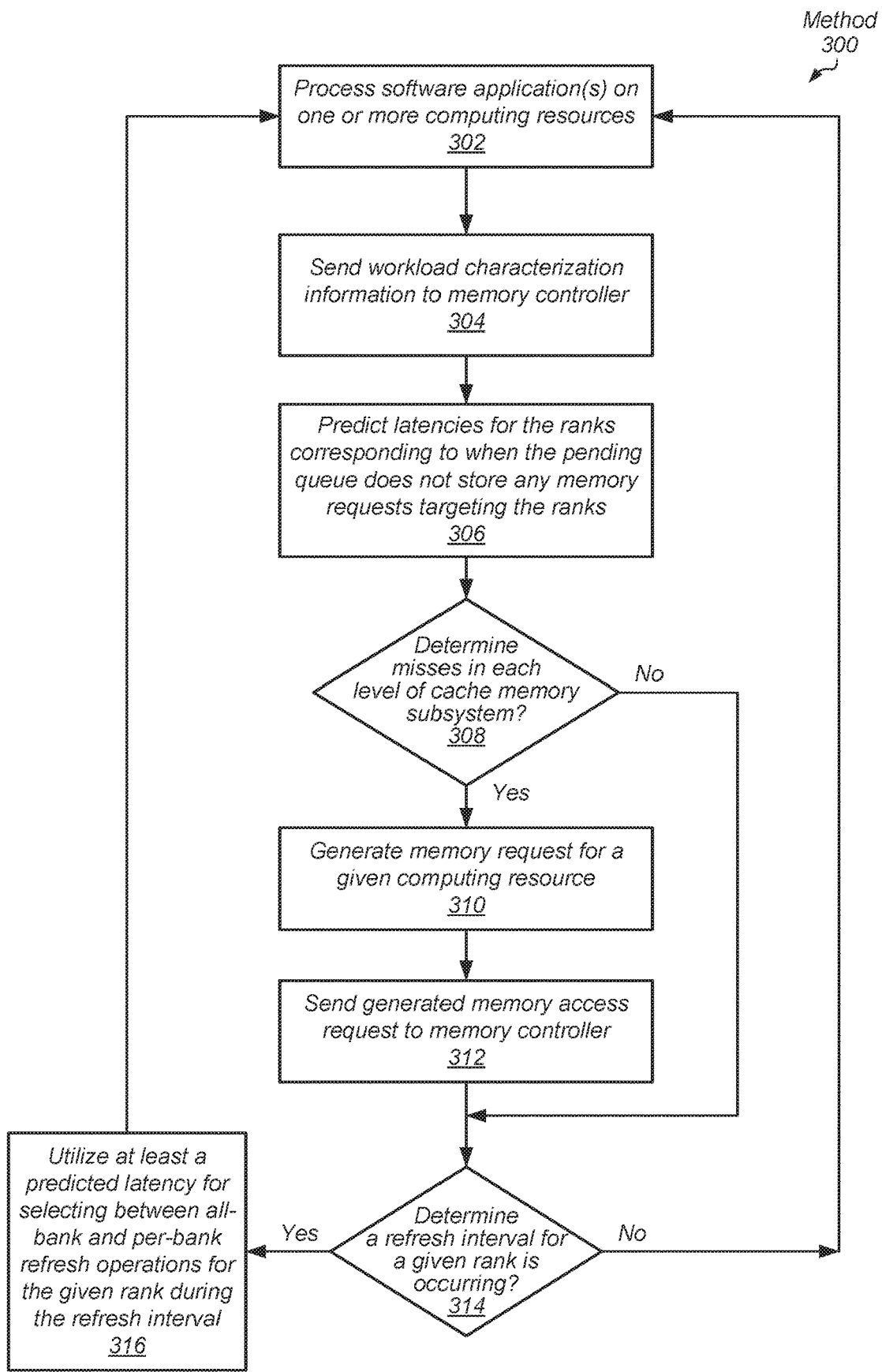
FIG. 3 is a flow diagram of one embodiment of a method for selecting refresh operations for refreshing a rank based on predicted latencies based on workload and total bank latencies.

Referring now to FIG. 3, one embodiment of a method 300 for selecting refresh operations based on predicted latencies between accesses of a rank is shown. For purposes of discussion, the steps in this embodiment (as well as in FIG. 4) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 300.

In the method 300 shown, one or more computing resources process one or more software applications (block 302). Examples of a computing resource include central processing units, graphics processing units, as well as others. Workload characterization information is sent to the memory controller (block 304). Examples of this information include one or more of computing resource IDs, a number of threads assigned to computing resources, performance states of computing resources, and hit and/or miss rates of cache memory subsystems. Based on the received information, mappings of targeted addresses to ranks in the memory device, and maintained counter values, latencies for the ranks corresponding to when the pending queue does not store any memory requests targeting the ranks are predicted (block 306). As described earlier, the predicted latency for a given rank is an amount of time the pending queue for storing outstanding memory requests does not store any memory requests targeting the given rank.

If misses in each level of cache memory subsystem are determined ("yes" branch of the conditional block 308), then a memory request for a given computing resource is generated (block 310). The generated memory request is sent to the memory controller (block 312). If misses in each level of cache memory subsystem are not determined ("no" branch of the conditional block 308), then control flow of method 300 moves to conditional block 314. If it is determined a refresh interval is occurring for a given rank ("yes" branch of the conditional block 314), then at least predicted latencies are utilized for selecting between all-bank and per-bank refresh operations for the given rank during the refresh interval (block 316). To select refresh operations, in some embodiments, the memory controller selects the per-bank refresh operation for the given rank when there are pending memory requests targeting the given rank. In various embodiments, when there are no pending memory requests targeting the given rank, the memory controller compares the predicted latency and the latency of the all-bank refresh operation to select refresh operations in addition to comparing the predicted latency to a total bank latency of a number of remaining banks to be refreshed.

Figure 4:
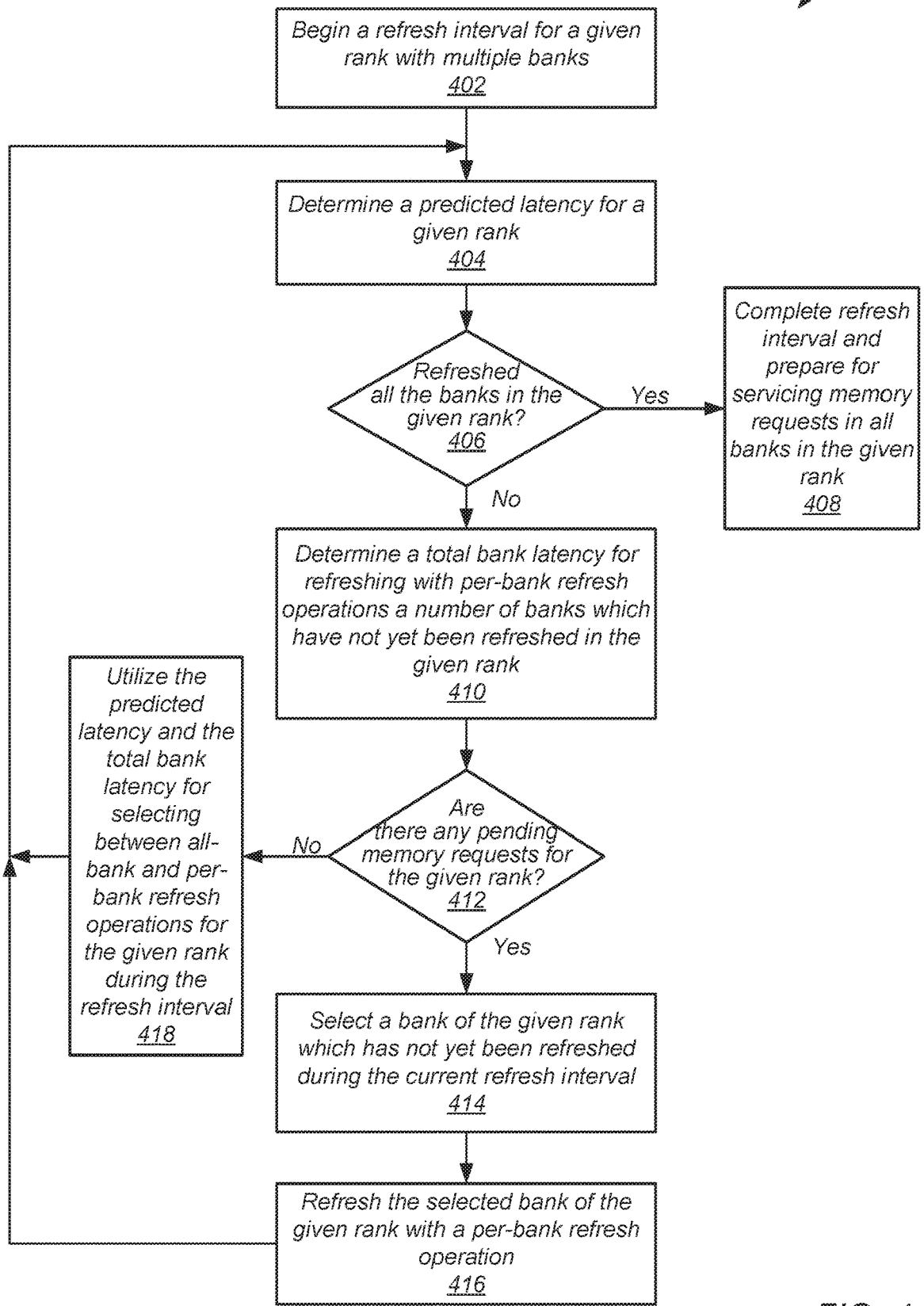
FIG. 4 is a flow diagram of one embodiment of a method for selecting refresh operations for refreshing a rank based on predicted latencies based on workload and total bank latencies.

Referring to FIG. 4, another embodiment of a method 400 for selecting refresh operations for refreshing a rank based on predicted latencies between accesses of a rank based on workload is shown. A refresh interval for a given rank with multiple banks begins (block 402). A predicted latency is determined for a given rank (block 404). As described earlier, the predicted latency for the given rank is an amount of time the pending queue for storing outstanding memory requests does not store any memory requests targeting the given rank. As described earlier for blocks 302 and 304 of method 300 (of FIG. 3), workload characterization information, mappings of targeted addresses to ranks in the memory device, and maintained counter values are used to predict latencies for the ranks. If all the banks in the given rank are refreshed ("yes" branch of the conditional block 406), then the refresh interval is completed and the memory device is prepared to service memory requests in all banks in the given rank (block 408).

If all the banks in the given rank are not refreshed ("no" branch of the conditional block 406), then a total bank latency for the given rank is determined (block 410). The total bank latency is an amount of time for refreshing a number of banks which have not yet been refreshed in the given rank with per-bank refresh operations. For example, if the latency for the per-bank refresh operation is 60 ns, and 6 of the 8 banks in the given rank are already refreshed, then the total bank latency is 2 banks times 60 ns/bank, or 120 ns. The total bank latency can also be measured as a number of clock cycles.

If there are any pending memory requests for the given rank ("yes" branch of the conditional block 412), then a bank is selected from the given rank which has not yet been refreshed during the current refresh interval (block 414). The selected bank of the given rank is refreshed with a per-bank refresh operation (block 416). Afterward, control flow of method 400 returns to block 404. If there are no pending memory requests for the given rank ("no" branch of the conditional block 412), then the predicted latency and the total bank latency are utilized for selecting between all-bank and per-bank refresh operations for the given rank during the refresh interval (block 418). Afterward, control flow of method 400 returns to block 404. Again, in various embodiments, the predicted latency is an amount of time the pending queue for storing outstanding memory requests does not store any memory requests targeting the given rank.

Figure 5:
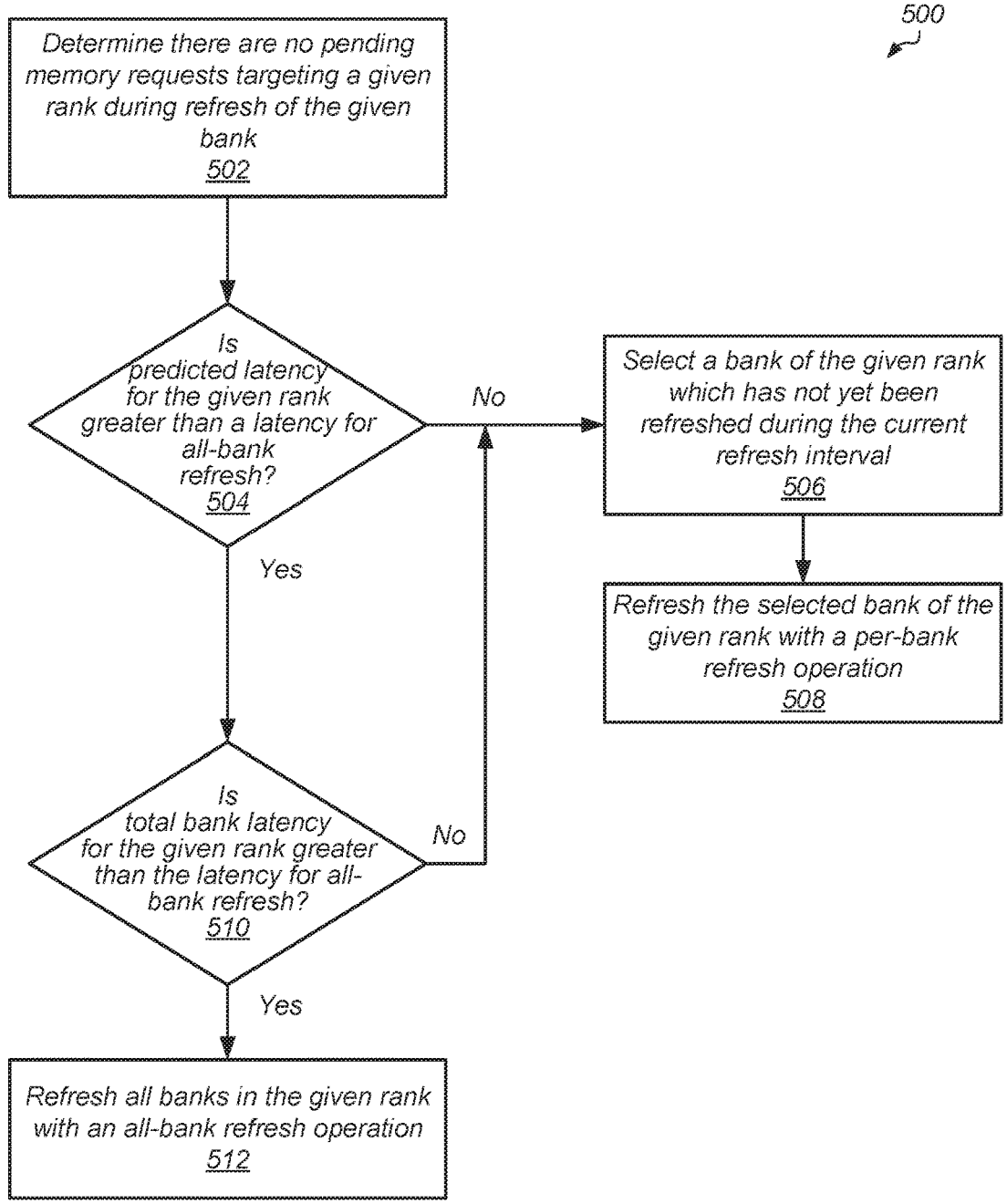
FIG. 5 is a flow diagram of one embodiment of a method for selecting refresh operations for refreshing a rank based on predicted latencies based on workload and total bank latencies.

Referring to FIG. 5, another embodiment of a method 500 for selecting refresh operations for refreshing a rank based on predicted latencies between accesses of a rank based on workload is shown. A refresh interval has begun, but the refresh interval has not yet completed. At this point in time, it is determined that there are no pending memory requests targeting a given rank during refresh of the given bank (block 502). This determination is similar to reaching block 418 of method 400 (of FIG. 4). As described earlier, the predicted latency for the given rank is an amount of time the pending queue in the memory controller for storing outstanding memory requests does not store any memory requests targeting the given rank.

If the predicted latency is not greater than a latency for an all-bank refresh operation ("no" branch of the conditional block 504), then a bank is selected from the given rank which has not yet been refreshed during the current refresh interval (block 506). The selected bank of the given rank is refreshed with a per-bank refresh operation (block 508). For example, if the predicted latency is 90 ns and the latency for the all-bank refresh operation is 130 ns, then it is predicted that a memory request targeting the given rank will be stored in the pending queue in the memory controller before the all-bank refresh operation completes. Therefore, per-bank refresh operations are selected for refreshing the banks in the given rank.

As described earlier, the total bank latency for the given rank is the amount of time for refreshing a number of banks which have not yet been refreshed in the given rank with per-bank refresh operations. If the predicted latency is greater than the latency for the all-bank refresh operation ("yes" branch of the conditional block 504), but the total bank latency for the given rank is not greater than the latency for the all-bank refresh operation ("no" branch of the conditional block 510), then control flow of method 500 moves to block 506 where a bank is selected for the per-bank refresh operation. For example, if the predicted latency is 200 ns and the latency for the all-bank refresh operation is 130 ns, then it is predicted that a memory request targeting the given rank will not be stored in the pending queue in the memory controller before the all-bank refresh operation completes. However, if the latency for the per-bank refresh operation is 60 ns, and 6 of the 8 banks in the given rank are already refreshed, then the total bank latency is 2 banks times 60 ns/bank, or 120 ns. Each of the latency for the all-bank refresh operation (130 ns) and the total bank latency (120 ns) is less than the predicted latency (200 ns), so each choice between all-bank refresh operation and per-bank refresh operation is predicted to complete before a memory request targeting the given rank is predicted to be stored in the pending queue in the memory controller. However, the total bank latency is smaller than the latency for the all-bank refresh operations, so selecting per-bank refresh operations for the two remaining banks is performed.

If the predicted latency is greater than the latency for the all-bank refresh operation ("yes" branch of the conditional block 504), and the total bank latency for the given rank is greater than the latency for the all-bank refresh operation ("yes" branch of the conditional block 510), then all banks in the given rank are refreshed with an all-bank refresh operation (block 512). For example, if the predicted latency is 200 ns and the latency for the all-bank refresh operation is 130 ns, then it is predicted that a memory request targeting the given rank will not be stored in the pending queue in the memory controller before the all-bank refresh operation completes. If the latency for the per-bank refresh operation is 60 ns, and 5 of the 8 banks in the given rank are already refreshed, then the total bank latency is 3 banks times 60 ns/bank, or 180 ns. Each of the latency for the all-bank refresh operation (130 ns) and the total bank latency (180 ns) is less than the predicted latency (200 ns), so each choice between all-bank refresh operation and per-bank refresh operation is predicted to complete before a memory request targeting the given rank is predicted to be stored in the pending queue in the memory controller. However, the latency for the all-bank refresh operation is smaller than the total bank latency, so selecting all-bank refresh operation is performed.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A computing system comprising:
   a communication fabric;
   one or more computing resources configured to:
      execute one or more applications; and
      generate memory access requests;
   a memory controller coupled to a memory device comprising a plurality of ranks, each rank comprising a plurality of banks;
   wherein the memory controller is configured to:
      receive the memory access requests via the communication fabric;
      receive information identifying the one or more applications;
      predict a first latency based at least upon the received information, wherein the first latency is an amount of time a pending queue for storing outstanding memory requests does not store any memory requests targeting a given rank of the plurality of ranks; and determine whether to perform an all-bank refresh operation for the given rank or perform a per-bank refresh operation on a given bank of the plurality of banks in the given rank based at least upon comparing the first latency and a second latency of an all-bank refresh operation;

in response to receiving an indication to start a refresh interval for the given rank:
  select one or more refresh operations based upon the first latency; and
  perform the selected one or more refresh operations on the given rank.

2. The computing system as recited in claim 1, wherein the memory controller is configured to perform a per-bank refresh operation on a given bank of the plurality of banks, in response to determining the first latency is less than the second latency.

3. The computing system as recited in claim 1, wherein the memory controller is configured to determine a third latency as an amount of time for refreshing a number of banks which have not yet been refreshed in the given rank with per-bank refresh operations.

4. The computing system as recited in claim 3, wherein the memory controller is configured to perform the all-bank refresh operation for the given rank, in response to determining:
  there are no pending memory requests targeting the given rank;
  the first latency is greater than the second latency; and
  the third latency is greater than the second latency.

5. The computing system as recited in claim 3, wherein the memory controller is configured to perform a per-bank refresh operation on a given bank of the plurality of banks, in response to determining,
  there are no pending memory requests targeting the given rank;
  the first latency is greater than the second latency; and
  the third latency is less than the second latency.

6. The computing system as recited in claim 1, wherein predicting the first latency comprises identifying which ranks of the plurality of ranks are accessed by the one or more applications.

7. The computing system as recited in claim 1, wherein predicting the first latency comprises identifying power-performance states of the one or more computing resources executing the one or more applications.

8. The computing system as recited in claim 1, wherein predicting the first latency comprises identifying miss rates for a cache memory subsystem for the one or more computing resources.

9. A method, comprising:
  executing, by one or more computing resources, one or more applications;
  generating, by the one or more computing resources, memory access requests for data stored in a memory device comprising a plurality of ranks, each rank comprising a plurality of banks;
  receiving, by a memory controller, the memory access requests;
  receiving, by the memory controller, information identifying the one or more applications;
  predicting, by the memory controller, a first latency between accesses of a given rank of the plurality of ranks based at least upon the received information; and
  determining whether to perform an all-bank refresh operation for the given rank or perform a per-bank refresh operation on a given bank of the plurality of banks in the given rank based at least upon comparing the first latency and a second latency of an all-bank refresh operation;

in response to receiving an indication to start a refresh interval for the given rank:
    selecting, by the memory controller, one or more refresh operations based upon the first latency; and
    performing, by the memory controller, the selected one or more refresh operations on the given rank.

10. The method as recited in claim 9, further comprising performing a per-bank refresh operation on a given bank of the plurality of banks, in response to determining the first latency is less than the second latency.

11. The method as recited in claim 9, further comprising determining a third latency as an amount of time for refreshing a number of banks which have not yet been refreshed in the given rank with per-bank refresh operations.

12. The method as recited in claim 11, further comprising performing the all-bank refresh operation for the given rank, in response to determining:
  there are no pending memory requests targeting the given rank;
  the first latency is greater than the second latency; and
  the third latency is greater than the second latency.

13. The method as recited in claim 11, further comprising performing a per-bank refresh operation on a given bank of the plurality of banks, in response to determining,
  there are no pending memory requests targeting the given rank;
  the first latency is greater than the second latency; and
  the third latency is less than the second latency.

14. A memory controller comprising:
  a first interface for receiving memory access requests generated by one or more computing resources executing one or more applications;
  a second interface for sending the memory access requests to a memory device comprising a plurality of ranks, each rank comprising a plurality of banks; and
  control logic, wherein the control logic is configured to:
    receive information identifying the one or more applications;
    predict a first latency between accesses of a given rank of the plurality of ranks based at least upon the received information; and
    determine whether to perform an all-bank refresh operation for the given rank or perform a per-bank refresh operation on a given bank of the plurality of banks in the given rank based at least upon comparing the first latency and a second latency of an all-bank refresh operation;
    in response to receiving an indication to start a refresh interval for the given rank:
      select one or more refresh operations based upon the first latency; and
      perform the selected one or more refresh operations on the given rank.

15. The memory controller as recited in claim 14, wherein the control logic is configured to perform a per-bank refresh operation on a given bank of the plurality of banks, in response to determining the first latency is less than the second latency.

16. The memory controller as recited in claim 14, wherein the control logic is configured to determine a third latency as an amount of time for refreshing a number of banks which have not yet been refreshed in the given rank with per-bank refresh operations.

17. The memory controller as recited in claim 16, wherein the control logic is configured to perform the all-bank refresh operation for the given rank, in response to determining:
  there are no pending memory requests targeting the given rank;
  the first latency is greater than the second latency; and
  the third latency is greater than the second latency.

* * * * *